(12) United States Patent
Blalock et al.

(10) Patent No.: US 7,465,406 B2
(45) Date of Patent: *Dec. 16, 2008

(54) METHOD OF EXPOSING A SUBSTRATE TO A SURFACE MICROWAVE PLASMA, ETCHING METHOD, DEPOSITION METHOD, SURFACE MICROWAVE PLASMA GENERATING APPARATUS, SEMICONDUCTOR SUBSTRATE ETCHING APPARATUS, SEMICONDUCTOR SUBSTRATE DEPOSITION APPARATUS, AND MICROWAVE PLASMA GENERATING ANTENNA ASSEMBLY

(75) Inventors: Guy T. Blalock, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/448,996

(22) Filed: Jun. 7, 2006

(65) Prior Publication Data

US 2006/0228891 A1 Oct. 12, 2006

Related U.S. Application Data

(63) Continuation of application No. 10/293,025, filed on Nov. 12, 2002, now Pat. No. 7,097,782.

(51) Int. Cl.
*H01L 21/302* (2006.01)
(52) U.S. Cl. .................. 216/69; 438/714; 438/726; 427/575
(58) Field of Classification Search ................ None
See application file for complete search history.

(56) References Cited

U.S. PATENT DOCUMENTS 5,874,706 A 2/1999 Ishii (Continued)

FOREIGN PATENT DOCUMENTS

EP 1167567 A1 1/2002

(Continued)

OTHER PUBLICATIONS

Yamamoto et al "Design of Radial Slot Antennas at 8.3 GHz for Large Area Uniform Plasma Generation" JJAP, 38, 2082-2088, Apr. 1999.*

(Continued)

*Primary Examiner*—Anita K Alanko
(74) *Attorney, Agent, or Firm*—Wells St. John P.S.

(57) ABSTRACT

In certain implementations, methods and apparatus include an antenna assembly having at least two overlapping and movable surface microwave plasma antennas. The antennas have respective pluralities of microwave transmissive openings formed therethrough. At least some of the openings of the respective antennas overlap with at least some of the openings of another antenna, and form an effective plurality of microwave transmissive openings through the antenna assembly. Microwave energy is passed through the effective plurality of openings of the antenna assembly and to a flowing gas effective to form a surface microwave plasma onto a substrate received within the processing chamber. At least one of the antennas is moved relative to another of the antennas to change at least one of size and shape of the effective plurality of openings through the antenna assembly effective to modify microwave energy passed through the antenna assembly to the substrate.

16 Claims, 6 Drawing Sheets

U.S. PATENT DOCUMENTS

| | | |
|---|---|---|
| 5,976,623 A | 11/1999 | DeSantolo et al. |
| 6,015,762 A | 1/2000 | Yamazaki et al. |
| 6,158,383 A | 12/2000 | Watanabe et al. |
| 6,200,893 B1 | 3/2001 | Sneh |
| 6,343,565 B1 | 2/2002 | Hongoh |
| 6,355,561 B1 | 3/2002 | Sandhu et al. |
| 6,369,763 B1 | 4/2002 | Norris et al. |
| 6,399,520 B1 | 6/2002 | Kawakami et al. |
| 6,416,822 B1 | 7/2002 | Chiang et al. |
| 6,468,924 B2 | 10/2002 | Lee et al. |
| 6,537,925 B2 | 3/2003 | Kim et al. |
| 6,620,723 B1 | 9/2003 | Byun et al. |
| 6,630,201 B2 | 10/2003 | Chiang et al. |
| 6,847,003 B2 | 1/2005 | Ishii et al. |
| 7,115,529 B2 | 10/2006 | Doan et al. |
| 2001/0052323 A1 | 12/2001 | Yieh et al. |
| 2002/0000598 A1 | 1/2002 | Kang et al. |
| 2002/0076507 A1 | 6/2002 | Chiang et al. |
| 2002/0119673 A1 | 8/2002 | Yieh et al. |
| 2002/0197856 A1 | 12/2002 | Matsuse et al. |
| 2003/0143328 A1 | 7/2003 | Chen et al. |
| 2003/0168001 A1 | 9/2003 | Sneh |
| 2004/0018304 A1 | 1/2004 | Chung et al. |
| 2004/0038525 A1 | 2/2004 | Meng et al. |
| 2004/0089631 A1 | 5/2004 | Blalock et al. |

FOREIGN PATENT DOCUMENTS

| | | | |
|---|---|---|---|
| EP | 03/087431 A2 | | 10/2003 |
| JP | 05343334 A | * | 12/1993 |
| JP | 1993343334 A | | 12/1993 |
| JP | 2001274150 | | 10/2001 |
| JP | 2002-305195 | | 10/2002 |
| TW | 479312 C2 | | 3/2002 |
| WO | WO0117692 | | 3/2001 |
| WO | WO0201628 | | 1/2002 |
| WO | 02/43114 A2 | | 5/2002 |
| WO | 02/045871 A1 | | 6/2002 |

OTHER PUBLICATIONS

Yamamoto et al., "Design of Radial Line Slot Antennas at 8.3 GHz for Large Area Uniform Plasma Generation", 38 Jpn. J. Appl. Phys., Part 1, No. 4A, pp. 2082-2088 (Apr. 1999).

Vossen et al.; "The Film Processes"; 1978; Academic Press, Inc.; 5 pp.

* cited by examiner

METHOD OF EXPOSING A SUBSTRATE TO A SURFACE MICROWAVE PLASMA, ETCHING METHOD, DEPOSITION METHOD, SURFACE MICROWAVE PLASMA GENERATING APPARATUS, SEMICONDUCTOR SUBSTRATE ETCHING APPARATUS, SEMICONDUCTOR SUBSTRATE DEPOSITION APPARATUS, AND MICROWAVE PLASMA GENERATING ANTENNA ASSEMBLY

RELATED PATENT DATA

This patent resulted from a continuation application of U.S. patent application Ser. No. 10/293,025, filed Nov. 12, 2002 now U.S. Pat No. 7,097,082, entitled "Method of Exposing a Substrate to a Surface Microwave Plasma, Etching Method, Deposition Method, Surface Microwave Plasma Generating Apparatus, Semiconductor Substrate Etching Apparatus, Semiconductor Substrate Deposition Apparatus, and Microwave Plasma Generating Antenna Assembly", naming Guy T. Blalock and Trung Tri Doan as inventors, the disclosure of which is incorporated by reference.

TECHNICAL FIELD

This invention relates to methods of exposing substrates to surface microwave plasmas, to etching methods, to deposition methods, to surface microwave plasma generating apparatus, to semiconductor substrate etching apparatus, to semiconductor substrate deposition apparatus, and to microwave plasma generating antenna assemblies.

BACKGROUND OF THE INVENTION

Substrates are processed or otherwise exposed to plasma for numerous reasons. Examples include etching material from the substrate, depositing a material on the substrate, or to treat or otherwise modify a material already deposited on the substrate without necessarily etching it therefrom. The invention was principally motivated in plasma processing associated with semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Plasma generation and application can occur in a number of manners, for example by RF and microwave means. One particular type of plasma generation includes surface microwave plasma. In the context of this document, "surface microwave plasma" is defined as a plasma generated in a gas against a substrate being processed by transmitting microwave energy from a plurality of discrete, spaced microwave emitting sources, and whether conducted in existing or yet-to-be-developed manners. One existing manner of doing so is by use of an antenna, such as a surface plane antenna (SPA) or a radial line slot antenna (RLSA). By way of example only, examples can be found in U.S. Pat. Nos. 6,399,520 and 6,343,565.

Existing such antennas are typically composed of a material that is blocking of microwave energy (i.e., metal) and which includes an array of microwave transmissive openings formed therethrough. The openings might be completely void of material, or might include solid or other microwave transmissive material, for example silicon dioxide. Appropriate microwave energy applied to the backside of the antenna propagates radially across the antenna and through the individual openings. A gas is flowed between the antenna and the substrate being processed for generating a surface microwave plasma from the gas by the energy applied through the openings. Such can be used to provide a very low power plasma, which is radially equally distributed across a substrate surface being processed and which can be precisely controlled.

The size, shape, and correspondingly, the effective pattern of openings on the surface plane antennas is typically determined by or optimized for the species of gases which are used for the plasma processing. Specifically, different gases (of course, including mixtures of gases) have different ionization potentials in part due to atomic weight and the availability of electrons in outer shells. Accordingly ideally, the size and shape of the openings are optimized depending upon what gas is being utilized. Typically, this means that different antenna designs are utilized for different processing gases, including mixtures of different processing gases. This can undesirably require the changing of the surface plane antennas intermediate processing with different gases, or providing a compromise antenna for certain mixtures of different gases which is not often optimized for any one gas or mixture of gases.

While the invention was motivated in addressing the above-described issues and problems, it is in no way so limited. The invention is only limited by the accompanying claims as literally worded, without interpretative or limiting reference to the specification and drawings, and in accordance with the doctrine of equivalents.

SUMMARY

The invention includes methods of exposing substrates to surface microwave plasmas, etching methods, deposition methods, surface microwave plasma generating apparatus, semiconductor substrate etching apparatus, semiconductor substrate deposition apparatus, and microwave plasma generating antenna assemblies. In one implementation, a method of exposing a substrate to a surface microwave plasma includes providing a processing apparatus comprising a processing chamber and an antenna assembly comprising at least two overlapping and movable surface microwave plasma antennas. The antennas have respective pluralities of microwave transmissive openings formed therethrough. At least some of the openings of the respective antennas overlap with at least some of the openings of another antenna, and form an effective plurality of microwave transmissive openings through the antenna assembly. A gas is flowed proximate the antennas. Microwave energy is passed through the effective plurality of openings of the antenna assembly and to the flowing gas effective to form a surface microwave plasma onto a substrate received within the processing chamber. At least one of the antennas is moved relative to another of the antennas to change at least one of size and shape of the effective plurality of openings through the antenna assembly effective to modify microwave energy passed through the antenna assembly to the substrate. Other implementations are contemplated. Aspects of the invention can be utilized in etching, deposition and/or other processing methods whether existing or yet-to-be-developed.

In one implementation, a method of exposing a substrate to a surface microwave plasma includes providing a processing apparatus comprising a processing chamber and an antenna assembly comprising at least one surface microwave plasma antenna. The antenna has a plurality of gas and microwave transmissive openings formed therethrough. Gas is flowed through the plurality of openings to the processing chamber while transmitting microwave energy through the plurality of openings to the processing chamber effective to form a surface microwave plasma onto a substrate received within the processing chamber.

In one implementation, a surface microwave plasma generating apparatus includes a substrate processing chamber. At least one gas injection port is provided to the processing chamber and at least one exhaust port is provided from the processing chamber. The apparatus includes a microwave plasma generator. The apparatus includes an antenna assembly operatively connected with the plasma generator and configured to form a surface microwave plasma within the processing chamber. The antenna assembly has at least two overlapping and movable surface microwave plasma antennas. The antennas have respective pluralities of microwave transmissive openings formed therethrough. At least some of the openings of the respective antennas overlap with at least some of the openings of another antenna and form an effective plurality of microwave transmissive openings through the antenna assembly. At least one of size and shape of the effective plurality of microwave transmissive openings are changeable by moving at least one of the antennas relative to another of the antennas. Such apparatus can be configured as etching, deposition, and/or other processors, whether existing or yet-to-be-developed. Other implementations are contemplated.

In one implementation, a microwave plasma generating antenna assembly has at least two overlapping and movable surface microwave plasma antennas. The antennas have respective pluralities of microwave transmissive openings formed therethrough. At least some of the openings of the respective antennas overlap with at least some of the openings of another antenna and form an effective plurality of microwave transmissive openings through the antenna assembly. At least one of size and shape of the effective plurality of microwave transmissive openings are changeable by moving at least one of the antennas relative to another of the antennas. Such an antenna assembly can be utilized to create a surface microwave plasma, and/or other plasma(s) whether existing or yet-to-be-developed.

Other implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
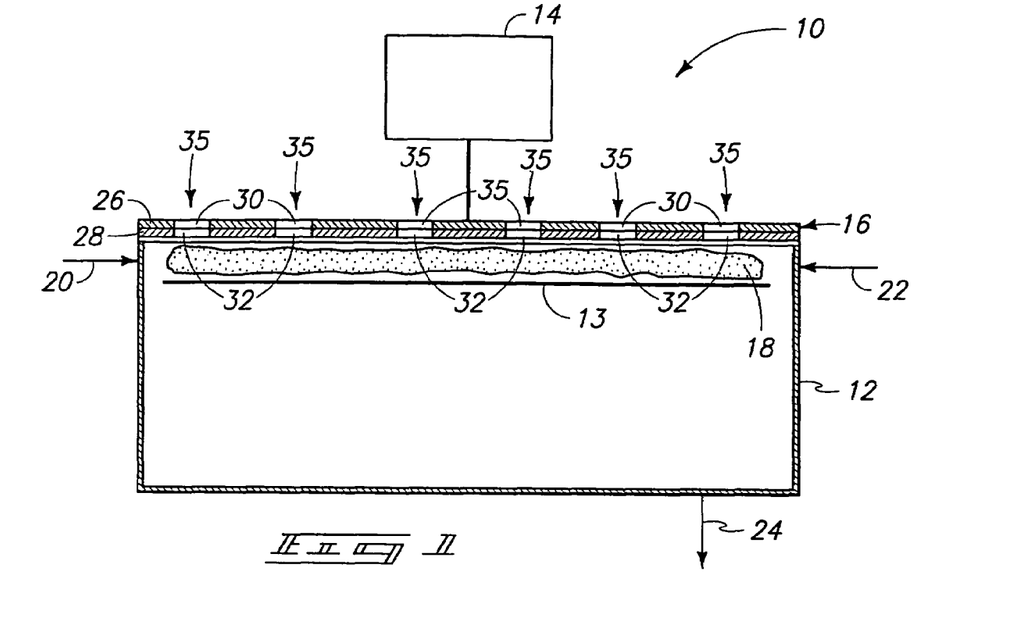
FIG. 1 is a diagrammatic sectional view of an exemplary surface microwave plasma generating apparatus in accordance with, and usable in accordance with, certain aspects of the invention.
Figure 2A:
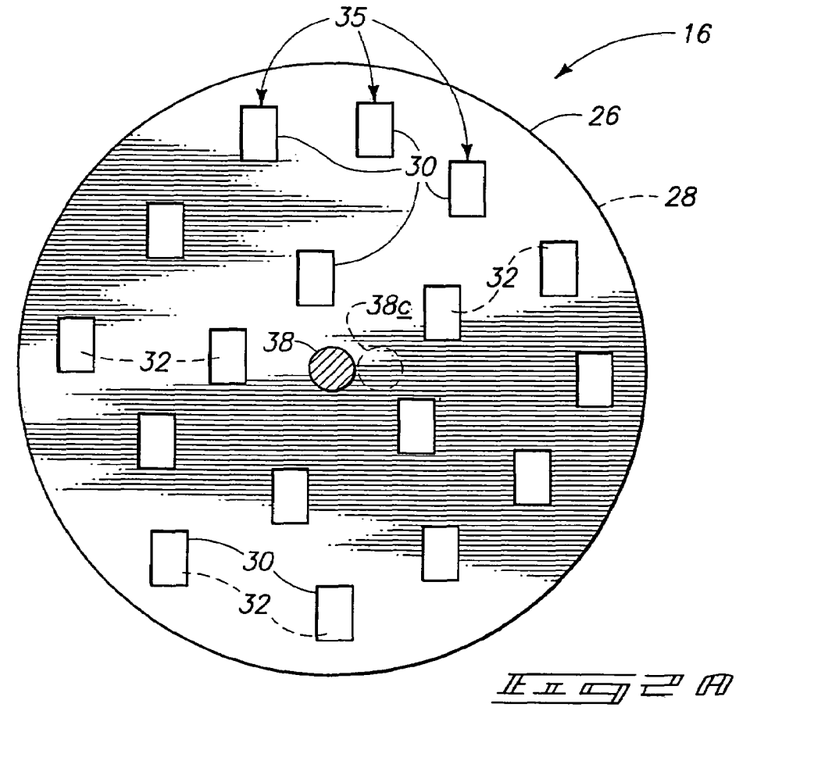
FIGS. 2A-2E are a series of diagrammatic top views of different antenna orientations associated with the FIG. 1 apparatus.

The invention encompasses methods and apparatus, with some exemplary preferred embodiments shown and described in connection with the accompanying figures. Referring initially to FIGS. 1 and 2A, a surface microwave plasma generating apparatus is indicated generally with reference numeral 10. By way of example only, such might be configured as a semiconductor substrate etching apparatus and/or a semiconductor substrate deposition apparatus. Processors and methods other than for the utilization of semiconductor substrates are contemplated, also. Apparatus 10 includes a substrate processing, etching and/or deposition chamber 12 within which a substrate 13 to be processed is received. Any deposition is preferably conducted by CVD means, including by ALD. A suitable support or mechanism (not shown) can be provided for supporting substrate 13 therein, and which might be temperature controlled, powered and/or otherwise configured for positioning a substrate 13 within chamber 12 as desired.

A microwave plasma generator 14 is operatively connected with a microwave plasma generating antenna assembly 16. Antenna assembly 16 is shown positioned immediately over chamber 12, and is otherwise configured to form a surface microwave plasma within processing chamber 12 as will be more fully described below by way of example. The side and base walls of chamber 12 are preferably made of any suitable material, for example metal. The upper wall of chamber 12 is made of any suitable dielectric which is transmissive of microwave energy therethrough to enable the formation of a surface microwave plasma 18 within chamber 12 proximate substrate 13. Any conceivable and/or yet-to-be developed processing chamber 12 and microwave plasma generation is contemplated, with no particular design or configuration, other than what is diagrammatically shown, constituting a particular preferred aspect of the invention. For example and by way of example only, U.S. Pat. Nos. 6,399,520 and 6,343,565 show exemplary surface microwave plasma generating apparatus, and are herein incorporated by reference. Further, in addition to microwave, energy generation is also contemplated in combination with microwave energy generation, and whether within or externally of chamber 12.

Chamber 12 includes at least one gas injection port thereto and at least one exhaust port therefrom. FIG. 1 diagrammatically depicts opposing injection ports 20 and 22, and an exhaust port 24. Any alternate configuration, such as showerheads, multiple ports or other means, whether existing or yet-to-be developed, are also of course contemplated for getting gas to the chamber and exhausting material from the chamber.

Antenna assembly 16 comprises at least two overlapping and movable surface microwave plasma antennas. The depicted preferred FIGS. 1 and 2A embodiments illustrate a first antenna 26 overlapping with a second antenna 28. An exemplary preferred spacing from the upper surface of substrate 13 to the lower surface of second antenna 28 is 65 mm. Of course, greater or smaller spacings can be utilized. The antennas have respective pluralities of microwave transmissive openings formed therethrough, for example a plurality of openings 30 with respect to antenna 26, and a plurality of openings 32 with respect to antenna 28. At least some of the openings of the respective antennas overlap with at least some of the openings of another of the antennas, with all of the openings of each antenna being shown in the FIGS. 1 and 2A embodiments as overlapping each other. The FIGS. 1 and 2A embodiments show overlapping openings 30 and 32 all being rectangle-shaped and of the same size, and completely overlapping one another. However, any alternately sized and shaped openings are contemplated, whether existing or yet-to- be developed. Further, all of the openings on a single antenna do not necessarily have to be equally displaced over the antenna, or all of the same size and shape on each antenna. By way of example only, exemplary alternate shapes and configurations are shown in U.S. Patent Nos. 6,399,520 and 6,343,565.

Figure 3:
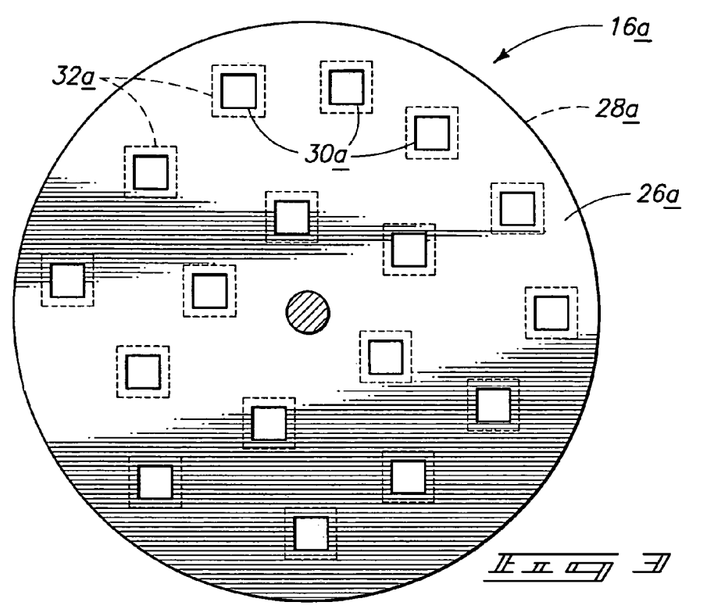
FIG. 3 is a diagrammatic top view of a different antenna assembly from that depicted in FIG. 2A.
Figure 4:
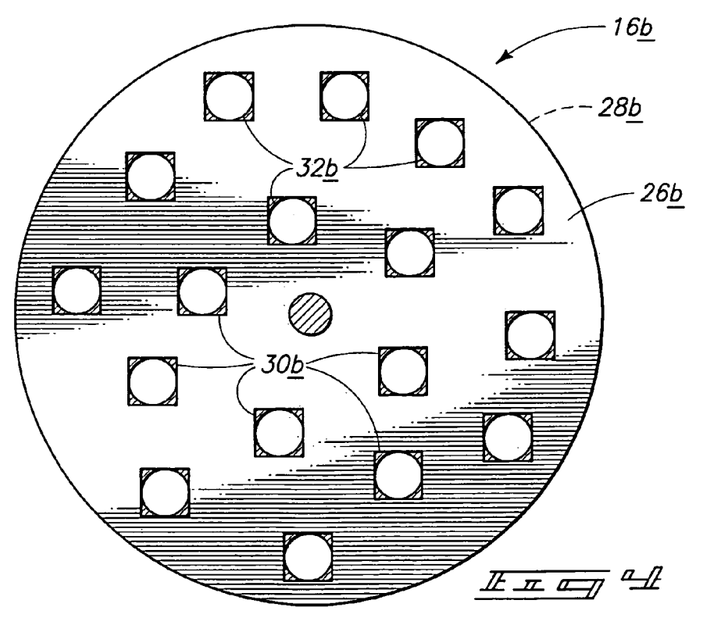
FIG. 4 is a diagrammatic top view of another different antenna assembly from that depicted in FIG. 2A.

Further and by way of example only, alternate exemplary embodiment antenna assemblies 16a and 16b are shown in FIGS. 3 and 4, respectively. Like numerals from the first-described embodiment are utilized where appropriate, with differences being indicated with respective suffixes "a" and "b". FIG. 3 depicts exemplary openings 30a and 32a as being of a common square shape, but different in size. Antenna assembly 16b depicts exemplary openings 30b as being square and openings 32b as being circular, and as having the same diameter as the length of a side of squares 30b.

In one embodiment, the overlapping openings have sizes and shapes which are the same with respect to at least two different of the antennas of the antenna assembly, for example as depicted in FIGS. 1 and 2A. Further in one embodiment, the overlapping openings have sizes and shapes which are the same with respect to different of all the antennas, for example as shown in FIGS. 1 and 2A, and as would be contemplated in one embodiment where more than two antennas are used in an antenna assembly in accordance with the invention. In one embodiment, the overlapping openings are configured to have sizes and shapes at least one of which is different with respect to at least two different of the antennas, for example as shown in each of FIGS. 3 and 4. In one embodiment, the invention contemplates the overlapping openings having sizes and shapes both of which are different with respect to at least two different of the antennas for example as shown in FIG. 4.

Some or all of the depicted openings might be merely voids formed within the otherwise typical microwave blocking material (i.e., metal) of antennas 26 and 28. Alternately by way of example only, such could be filled with a suitable microwave transmissive material, for example a suitable dielectric like silicon dioxide or aluminum oxide. Further, the preferred embodiment depicts antennas 26 and 28 as being received externally of processing chamber 12, although in a less preferred embodiment one, a portion of one, or all of the antennas might be received within processing chamber 12.

Regardless, the overlapping openings form an effective plurality of microwave transmissive openings 35 through antenna assembly 16 (FIGS. 1 and 2A). At least one of size and shape of the effective plurality of microwave transmissive openings 35 is changeable by moving at least one of the antennas relative to another of the antennas of the antenna assembly. Alternately considered in such preferred embodiment, the minimum two antennas are moveable relative to one another effective to modify the microwave energy emitted therefrom. Antenna assembly 16 is configured so that at least one of antennas 26 and 28 can be moved relative to the other. Such might be configured so that one antenna always remains stationary and another antenna is configured to only be movable, or both antennas might be configured to be movable. By way of example only, the mode of moving might be by rotating one antenna 26 and/or 28 relative to the other, and/or by laterally sliding one or both of the antennas relative to one another, for example by a straight linear sliding motion of the antenna(s) being moved.

FIG. 2A diagrammatically illustrates a post 38 associated concentrically with antenna 26, which could be configured in a manner which enables the rotation of antenna 26 relative to antenna 28. Antenna 28 might be configured to be stationary at all times, or likewise, could be configured to rotate or otherwise move relative to antenna 26. Further if desired, an eccentric rotational axis and support 38c could be provided if eccentric rotation of one or both of antennas 26 and 28 were desired.

Figure 2B:
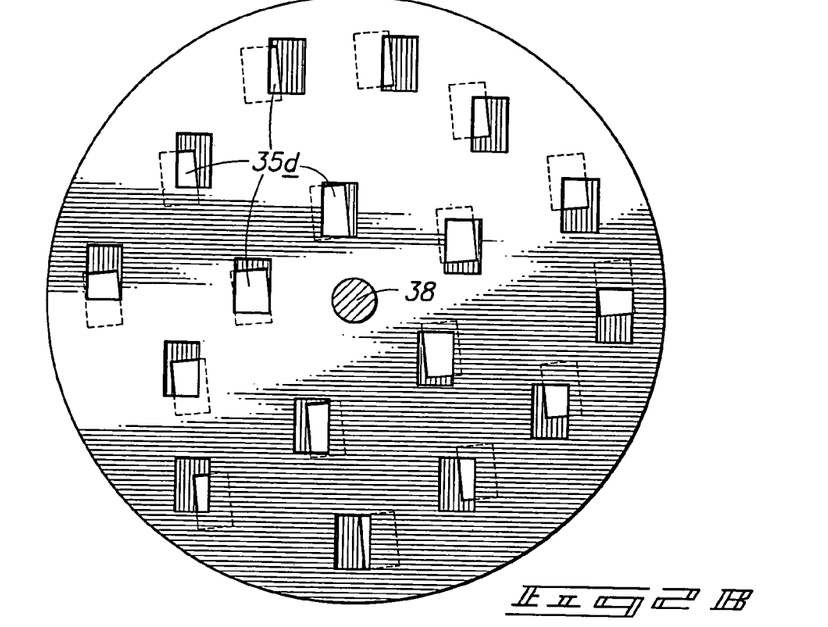

FIG. 2B illustrates an exemplary rotation of antennas 26 and 28a relative to one another resulting in a change of the size and shape of the effective plurality of microwave transmissive openings 35 through antenna assembly 14 to a plurality of openings 35d. In the depicted FIG. 2B embodiment, openings 35d are not uniform across the antenna assembly, with different sizes and shapes being created at different radial distances from central/concentric axis 38.

Figure 2C:
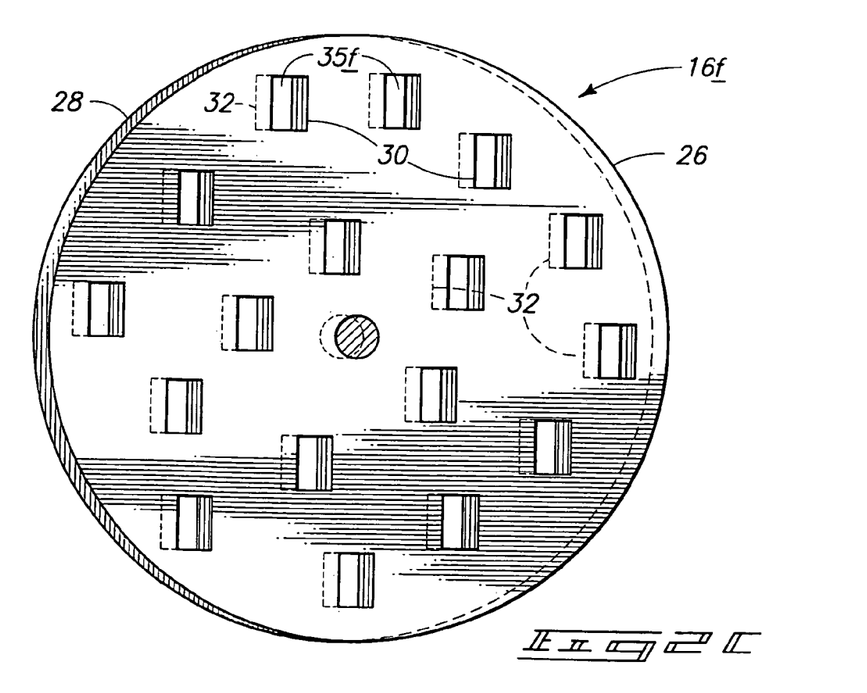
Figure 5:
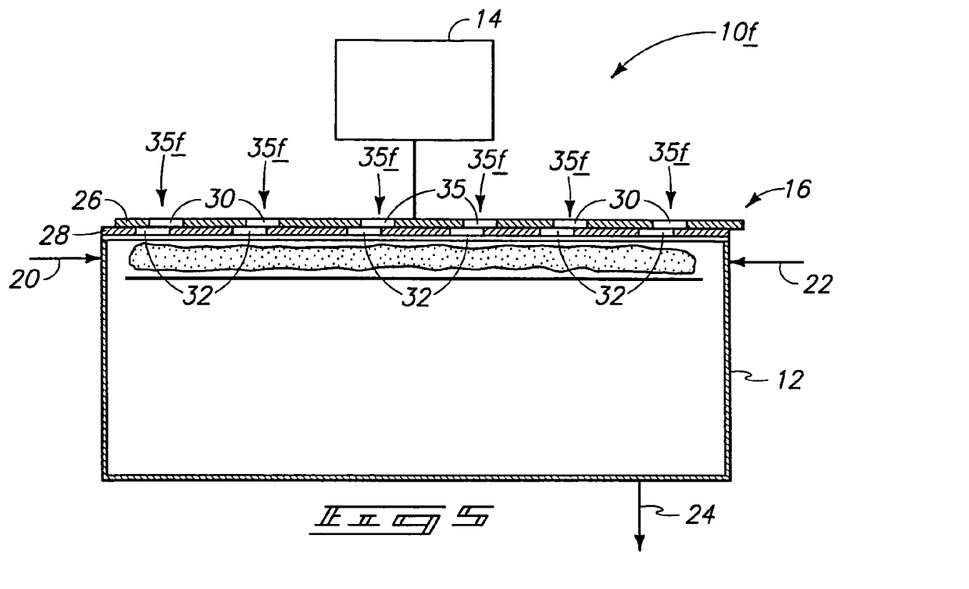
FIG. 5 is a diagrammatic sectional view of the FIG. 1 apparatus in an operational mode different from that depicted by FIG. 1, essentially corresponding to that depicted by FIG. 2C.

FIGS. 2C and 5 illustrate an exemplary alternate embodiment antenna assembly 16f. Like numerals from the first described embodiment have been utilized, with differences being indicated with the suffix "f". FIGS. 2C and 5 illustrate one or both of antennas 26 and 28 having been slid laterally relative to one another to create an effective plurality of microwave transmissive openings 35f, and which are uniform in size and shape across antenna assembly 16f.

Figure 2D:
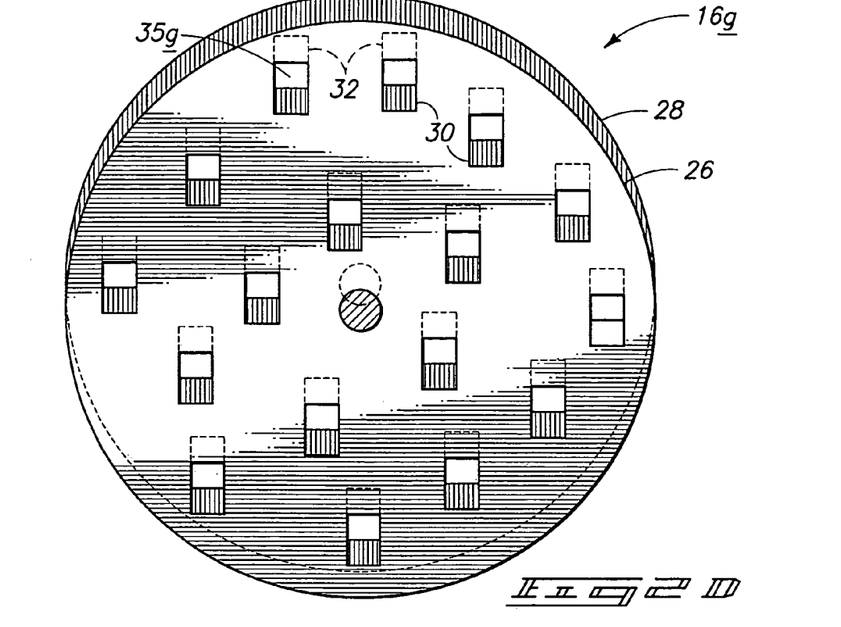
Figure 2E:
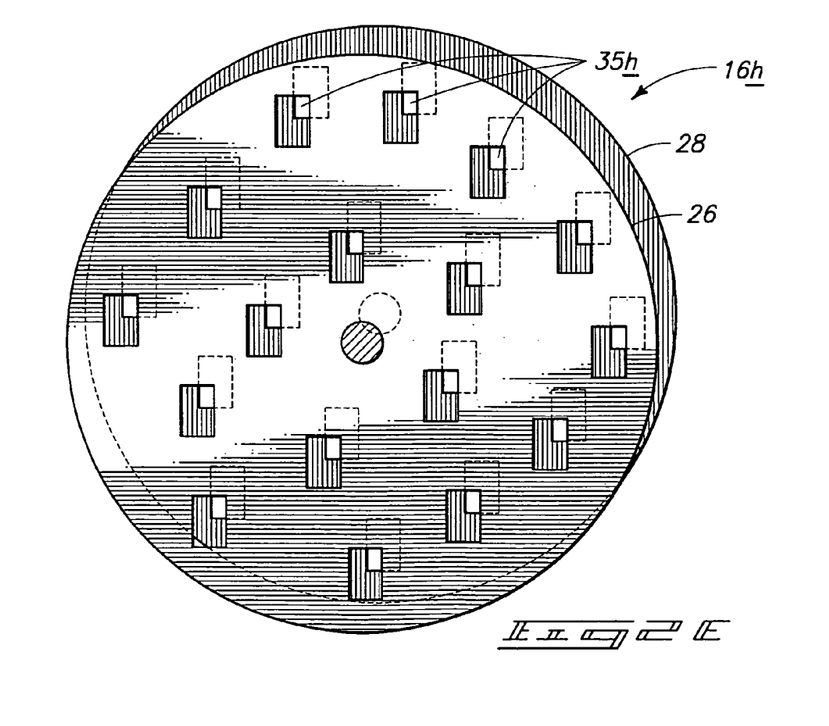

Further by way of example only, FIGS. 2D and 2E illustrate exemplary alternate embodiments or configurations 16g and 16h, respectively. Like numerals from the first described embodiment are utilized where appropriate, with differences being indicated with the suffixes "g" and "h", respectively.

Figure 6:
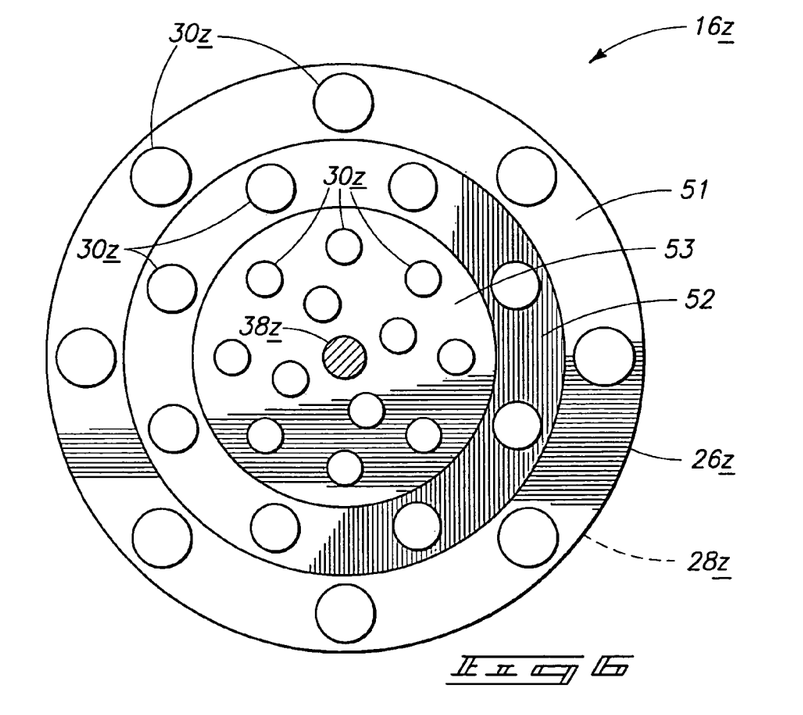
FIG. 6 is a diagrammatic top view of another different antenna assembly from that depicted in FIG. 2A.

In one exemplary implementation, at least one of the overlapping antennas comprises a plurality of pieces at least one of which is moveable relative to another piece. The moving to change at least one of size and shape of the effective plurality of openings can include moving the one piece relative to the another piece. By way of example only, FIG. 6 depicts an antenna assembly 16z. Like numerals from the first-described embodiment are utilized where appropriate, with differences being indicated with suffix "z" or different numerals. Antenna assemblies 26z and 28z comprise three movable pieces 51, 52 and 53. Such are shown as being received concentrically relative to one another. One, two or all three can be configured for movement relative to the other(s). Further and accordingly, antenna movement might be by moving one, two, or all three of such segments of one antenna relative to another antenna. Further, the movements might be of the same degree and direction, or differently with respect to degree and/or direction.

In one exemplary implementation, the antenna assembly comprises at least one surface microwave plasma antenna having a plurality of gas and microwave transmissive openings formed therethrough. Gas is flowed through the plurality of openings while transmitting microwave energy through the plurality of openings to the processing chamber effective to form a surface microwave plasma onto a substrate received within the processing chamber. Such implementation can be independent of use of an antenna assembly having at least two overlapping and movable surface microwave antennas. Yet in one exemplary and preferred aspect, such implementation contemplates use of an antenna assembly having at least two overlapping and movable surface microwave antennas. For example, and by way of example only, any of antenna assemblies 16 could be configured such that at least the lower surface of any of antennas 28 was received within chamber 12. The effective plurality of openings through any of antennas 26 and 28 could be voids such that gas can be flowed therethrough. Gas inlets could be configured to flow first to the antennas, and then into the chamber through the openings with the microwave energy which is transmitted through the same openings, or through different openings. In one implementation, the processing can be void of flowing any gas to the chamber during transmitting of the microwave energy other than through the plurality of openings.

Figure 7:
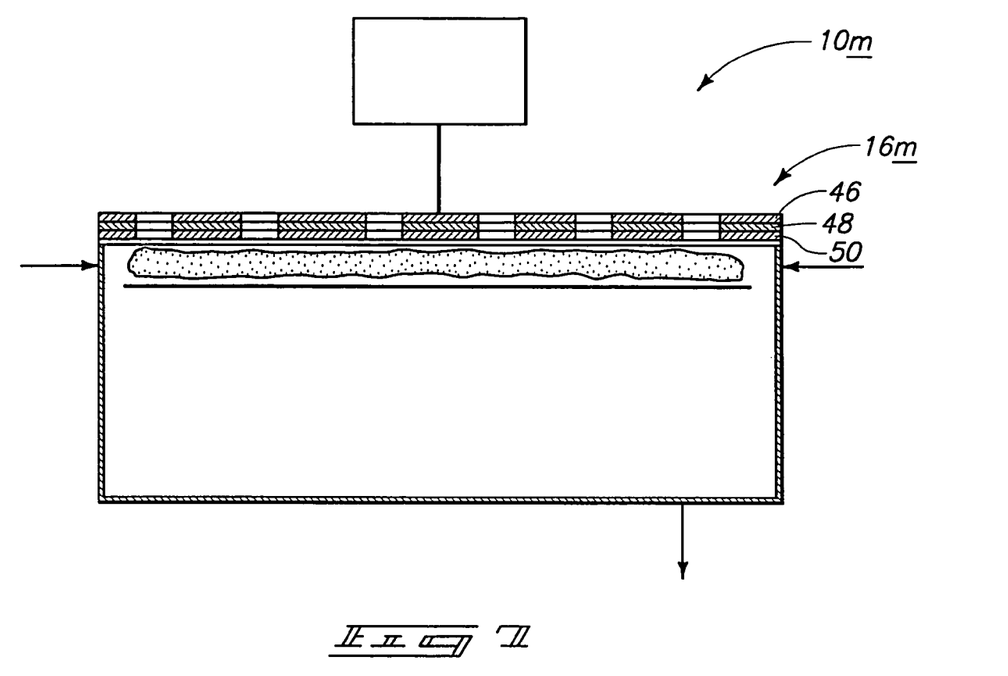
FIG. 7 is a diagrammatic sectional view of an alternate exemplary surface microwave plasma generating apparatus in accordance with, and usable in accordance with, certain aspects of the invention.

The above-described embodiments depict the antenna assembly as constituting two antennas. Any antenna configuration constituting more than two antennas within an antenna assembly is contemplated, also, and which by way of example only is shown with respect to FIG. 7. Such depicts an exemplary processing apparatus 10m comprising an antenna assembly 16m having three antennas 46, 48 and 50 having respective overlapping pluralities of openings formed therein. Any one, two or three of such antennas might be configured to be movable relative to any one or more of the others. Of course, more than three antennas are contemplated.

The above described embodiments depict and explain exemplary means for moving at least one of the first and second antennas relative to the other effective to modify microwave plasma energy transmitted to the processing chamber by the antenna assembly. Other means are of course contemplated, including by way of example only those which move antennas toward and away from one another generally axially.

In accordance with an exemplary methodical aspect of the invention, and by way of example only with reference to FIG. 1, gas is flowed to proximate antennas 26 and 28, for example through one or both of injection ports 20 and 22. Microwave energy is passed through the effective plurality of openings 35 of the antenna assembly and to the flowing gas effective to form a surface microwave plasma 18 onto a substrate 13 received within processing chamber 12. Of course, methodical aspects of the invention are contemplated independent of the preferred or other embodiments of a surface microwave plasma generating apparatus unless the method claim under analysis is literally so limited by an apparatus aspect literally worded therein. By way of example only, such plasma processing against substrate 13 might be for any of merely treating a surface of substrate 13, etching material therefrom, or depositing a material thereon. Regardless, at least one of the antennas 26 and 28 is moved relative to another of the antennas to change at least one of size and shape of the effective plurality of openings through the antenna assembly effective to modify microwave energy passed through the antenna assembly to the substrate. Such moving might be conducted while microwave energy is being passed through the effective openings and, for example, while gas is being flowed to chamber 12. Alternately by way of example only, such moving might be conducted while no microwave energy is passing through the effective plurality of openings, and by way of example only while no gas is flowing to the chamber. Further, depending upon the desires of the operator and the effect intended to be achieved, the gas flowing to the chamber might have the same composition or different compositions before and after the moving of at least one of the antennas has occurred. In the context of this document, a gas being "different in composition" means some gas having an alternate and/or additional reactive component from the gas to which it is being compared. Further by way of example only, the microwave energy fed to the antenna assembly before or after the moving of at least one of the antennas might have the same frequency and the same power or at least one of different frequency and different power.

In one preferred etching method, different composition first and second gases are flowed to the chamber for microwave generation before and after moving at least one of the antennas to etch material from the substrate. The material etched from the substrate by the first and second gas flowings, and passage of microwave energy thereto effective to generate the plasma, might be of common composition or different composition. For example and by way of example only, one composition gas might be utilized to etch one material, and another composition gas used to etch another different material. The different composition gases, having one or more different or additional components therein, might desirably have different preferred shapes and/or sizes of the effective openings through which the microwave energy is passed. The above exemplary methods and apparatus can enable or can employ optimization of the effective microwave openings for different gases and/or different desired processings without necessarily requiring disassembly or substitution of one prior art antenna configuration for another.

Further as described above, aspects of the invention contemplate a method of depositing material onto a substrate, for example utilizing different composition first and second gases to deposit different composition materials onto a substrate. Further, the invention contemplates intervening processing such that a deposited second-in-time material is not necessarily deposited onto (i.e., in contact with) the stated first/prior-in-time deposited material. Further, the invention contemplates deposition methods and apparatus specifically configured for atomic layer deposition, which involves discrete, successive monoatomic layer processings.

By way of example only, plasmas generated from microwaves are typically characterized by a very shallow skin depth, with the power being very effectively consumed in a very small volume. Surface microwave plasma typically results from generation of uniform plasma from microwave by means of distributing or spreading out the microwave energy prior to entry into the reaction chamber. The microwave power is typically converted from a waveguide transmission mode into waves that run parallel to an upper reactor plane antenna/window. This conversion to surface wave is produced by a diverting antenna that acts to reflect the microwaves. Once the microwaves are running parallel to the upper plane antenna, small openings in the plane antenna allow portions of the microwave to be released to the reaction chamber thus spreading the power over the desired area. The periodicity of the openings in the plane antenna determine the locality and uniformity of the power spread.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of exposing a substrate to a surface microwave plasma, comprising:

exposing a substrate to a plurality of spaced microwave emitting sources effective to generate a surface microwave plasma proximate the substrate from flowing gas; and while generating the surface microwave plasma proximate the substrate from flowing gas, changing at least one of size and shape of the spaced microwave emitting sources while flowing gas effective to modify the surface microwave plasma to which the substrate is exposed.

2. The method of claim 1 wherein the flowing gas has a different composition before and after the changing.

3. The method of claim 1 wherein the flowing gas has the same composition before and after the changing.

4. The method of claim 1 wherein microwave energy before and after the changing has at least one of different frequency and different power.

5. The method of claim 1 wherein microwave energy before and after the changing has the same frequency and the same power.

6. The method of claim 1 comprising changing shape.

7. The method of claim 1 comprising changing size.

8. The method of claim 1 comprising changing both size and shape.

9. The method of claim 1 wherein the exposing and the modified surface microwave plasma etch material from the substrate.

10. The method of claim 9 wherein the material etched from the substrate during the exposing and the material etched with the modified surface microwave plasma is of common composition.

11. The method of claim 9 wherein the material etched from the substrate during the exposing and the material etched with the modified surface microwave plasma are of different compositions.

12. The method of claim 9 wherein microwave energy during the exposing and of the modified surface microwave plasma have at least one of different frequency and different power.

13. The method of claim 9 wherein microwave energy during the exposing and of the modified surface microwave plasma have the same frequency and the same power.

14. The method of claim 1 wherein the exposing and the modified surface microwave plasma deposit material onto the substrate.

15. The method of claim 14 wherein microwave energy during the exposing and of the modified surface microwave plasma have at least one of different frequency and different power.

16. The method of claim 14 wherein microwave energy during the exposing and of the modified surface microwave plasma have the same frequency and the same power.

* * * * *

UNITED STATES PATENT AND TRADEMARK OFFICE
CERTIFICATE OF CORRECTION

| | |
|---|---|
| PATENT NO. | : 7,465,406 B2 |
| APPLICATION NO. | : 11/448996 |
| DATED | : December 16, 2008 |
| INVENTOR(S) | : Blalock et al. |

Page 1 of 1

It is certified that error appears in the above-identified patent and that said Letters Patent is hereby corrected as shown below:

In column 1, line 16, delete "7,097,082," and insert -- 7,097,782, --, therefor.

Signed and Sealed this

Twenty-fourth Day of March, 2009

JOHN DOLL
*Acting Director of the United States Patent and Trademark Office*